United States Patent [19]
Nishikawa

[11] Patent Number: 6,028,802
[45] Date of Patent: Feb. 22, 2000

[54] SINGLE-CHIP DYNAMIC RANDOM ACCESS MEMORY (DRAM) SYSTEM AND METHOD FOR OPERATING THE SYSTEM

[75] Inventor: Katsumi Nishikawa, Tokyo, Japan

[73] Assignee: NEC Corporation, Tokyo, Japan

[21] Appl. No.: 08/942,299

[22] Filed: Oct. 1, 1997

[30] Foreign Application Priority Data

Oct. 18, 1996 [JP] Japan ................................ 8-297618

[51] Int. Cl.$^7$ ................................................ G11C 7/02
[52] U.S. Cl. ................................. 365/207; 365/226
[58] Field of Search ................................ 365/207, 226

[56] References Cited

U.S. PATENT DOCUMENTS

| | | | |
|---|---|---|---|
| 4,413,330 | 11/1983 | Chao et al. | 365/205 |
| 5,140,199 | 8/1992 | Seo | 365/205 |
| 5,802,002 | 9/1998 | Ienaga | 365/207 |
| 5,814,851 | 9/1998 | Suh | 365/149 |
| 5,815,430 | 9/1998 | Verhaeghe et al. | 365/145 |

FOREIGN PATENT DOCUMENTS

| | | |
|---|---|---|
| 5-62467 | 3/1993 | Japan . |
| 5-89674 | 9/1996 | Japan . |
| 9-330591 | 12/1997 | Japan . |

*Primary Examiner*—David Nelms
*Assistant Examiner*—M. Tran
*Attorney, Agent, or Firm*—McGinn & Gibb, P.C.

[57] ABSTRACT

To operate a dynamic random access memory (DRAM) system faster and to make the DRAM system smaller, a DRAM system includes a DRAM cell array having a first bit line connected to a DRAM cell, wherein the DRAM cell stores a first voltage which is less than a second voltage, and a sense amplifier portion having a second bit line and for amplifying data of the second bit line to the first voltage. The sense amplifier portion connects electrically the first bit line and the second bit line, supplies a third voltage which is greater than the second voltage to the second bit line when the first bit line and the second bit line are connected electrically, and stops supplying the third voltage before a voltage of the second bit line reaches the first voltage.

21 Claims, 8 Drawing Sheets

SINGLE-CHIP DYNAMIC RANDOM ACCESS MEMORY (DRAM) SYSTEM AND METHOD FOR OPERATING THE SYSTEM

BACKGROUND OF THE INVENTION

The present invention generally relates to a single-chip dynamic random access memory (RAM) system, and more particularly to a DRAM system for achieving high speed oparation and high integration.

DESCRIPTION OF THE RELATED ART

With recent advancement of fabricating a single-chip semiconductor dynamic random access memory (DRAM) system, DRAM systems have become highly integrated, and a chip size of the DRAM system has become smaller.

For example, in systems today, 256 DRAM cells are attached to one bit line, although 128 DRAM cells have been attached to one bit line in previous conventional DRAM systems. Therefore, when a number of the DRAM cells is the same as that of the conventional DRAM system, a number of sense amplifiers connected to the bit lines is decreased according to the present technique. As a result, the DRAM system according to the present technique becomes smaller than the previous DRAM system.

However, a length of the bit line becomes longer because 256 DRAM cells are connected to the bit line. As a result, a capacity of the bit line becomes larger. Therefore, an operating speed of the DRAM system according to the present technique becomes lower than that of the previous DRAM system.

Further, in the DRAM system according to the present technique, an internal voltage used for operating the DRAM memory cells is lower than an external source voltage supplied to the DRAM system from outside of the chip of the DRAM system. The DRAM cells are made as small as possible. As a result, a dielectric breakdown voltage of the DRAM cells becomes low. For example, the external voltage $V_{cc}$ is set to $V_{cc}$=3.3 V in a 64 M DRAM system, and the internal voltage $V_{INT}$ is set to $V_{INT}$=2.2 V in the 64 M DRAM system.

Therefore, an operating speed of the DRAM system according to the present technique becomes lower than that of the previous DRAM system, because high voltage is not used for operating the DRAM cells, thereby protecting the DRAM cells.

For solving such problems, a DRAM system is fabricated as explained below.

FIGS. 1 and 2 show a conventional (e.g., it is related art but not prior art) DRAM system. Especially, FIG. 1 shows a signal generator for controlling a sense amplifier, and FIG. 2 shows the sense amplifier in the conventional DRAM system.

The signal generator shown in FIG. 1 receives a sense amplifier activate signal φ, and generates a transfer gate activate signal TG, a first reference voltage signal SAN, and a second reference voltage signal SAP, by using the amplifier activate signal φ.

The signal generator includes a sense amplifier activate circuit 1 for receiving the amplifier activate signal φ and a second control signal $\phi_p$ and for generating the first reference voltage signal SAN and the second reference voltage signal SAP, a transfer gate activate circuit 2 for receiving a first control signal $\phi_T$ and for generating the transfer gate activate signal TG, a first control signal generator 3 for receiving the amplifier activate signal φ and for generating the first control signal $\phi_T$, and a second control signal generator 4 for receiving the amplifier activate signal φ and for generating the second control signal $\phi_p$.

The first control signal generator 3 includes a node ND1 for receiving the amplifier activate signal φ, a delay circuit D1 having an input node connected to the node ND1 and an output node for outputting a delayed amplifier activate signal φ (e.g., wherein a delay time of the delay circuit D1 is predetermined), an inverter INV2 having an input node connected to the output node of the delay circuit D1 and an output node for outputting an inverted signal of the delayed amplifier activate signal φ, and a NAND circuit NAND1 having a first input node connected to the node ND1, a second input node connected to the output node of the inverter INV2, and an output node for outputting the first control signal $\phi_T$.

The transfer gate activate circuit 2 amplifies the first control signal $\phi_T$ and outputs the amplified first control signal $\phi_T$ as the transfer gate activate signal TG.

The second control signal generator 4 includes a node ND2 for receiving the amplifier activate signal φ, a delay circuit D2 having an input node connected to the node ND2 and an output node for outputting a delayed amplifier activate signal φ (e.g., wherein a delay time of the delay circuit D2 is predetermined), an inverter INV3 having an input node connected to the output node of the delay circuit D2 and an output node for outputting an inverted signal of the delayed amplifier activate signal φ, and a NAND circuit NAND2 having a first input node connected to the node ND2, a second input node connected to the output node of the inverter INV3, and an output node.

The sense amplifier activate circuit 1 includes a node ND3 for receiving the amplifier activate signal φ, an N-type metal oxide semiconductor (MOS) transistor Q3 having a gate connected to the node ND3 and a source-drain path between a first reference voltage (e.g., ground voltage) and a node ND4, an inverter INV1 having an input node connected to the node ND3 and an output node for outputting an inverted amplifier activate signal φ, a P-type MOS transistor Q2 having a gate connected to the output node of the inverter INV1 and a source-drain path between a node ND5 and a second reference voltage (e.g., the internal voltage $V_{INT}$), and a P-type MOS transistor Q1 having a source-drain path between the node ND5 and a third reference voltage (e.g., the external voltage $V_{cc}$). The first reference voltage signal SAN is outputted from the node ND4, and the second reference voltage signal SAP is outputted from the node ND5.

In FIG. 1, the output node of the NAND circuit NAND2 is connected to a gate of the P-type MOS transistor Q1 through inverters INV4 and INV5 connected in series for amplifying a voltage of the output node of the NAND circuit NAND2 and for outputting the second control signal $\phi_p$. However, the output node of the NAND circuit NAND2 may be connected directly to the gate of the P-type MOS transistor Q1, when the voltage of the output node of the NAND circuit NAND2 has a sufficient value. In this case, the inverters INV4 and INV5 are omitted.

Further, the first control signal $\phi_T$ may be used as the transfer gate activate signal TG without amplification by the transfer gate activate circuit 2, when the first control signal $\phi_T$ has a sufficient value. In this case, the transfer gate activate circuit 2 is omitted.

FIG. 2 shows the sense amplifier controlled by the signal generator shown in FIG. 1.

The sense amplifier includes a node ND11 for receiving the first reference voltage signal SAN, a node ND12 for receiving the second reference voltage signal SAP, an N-type MOS transistor Q20 having a source-drain path between the node ND11 and a node ND13, and a gate connected to a node ND14, an N-type MOS transistor Q21 having a source-drain path between the node ND11 and the node ND14, and a gate connected to the node ND13, a P-type MOS transistor Q24 having a source-drain path between the node ND12 and the node ND13, and a gate connected to the node ND14, a P-type MOS transistor Q25 having a source-drain path between the node ND12 and the node ND14, and a gate connected to the node ND13, and a pair of bit lines BL' and BL'⁻ respectively connected to the node ND13 and the node ND14.

Moreover, the sense amplifier includes a node ND15 for receiving a reference voltage $V_{ss}$, an N-type MOS transistor Q30 having a source-drain path between the node ND15 and a node ND16, and a gate connected to the bit line BL', an N-type MOS transistor Q31 having a source-drain path between the node ND15 and a node ND17, and a gate connected to the bit line BL'⁻, an N-type MOS transistor Q32 having a source-drain path between the node ND16 and a data line RO, and a gate connected to a column address selecting line YSW, and an N-type MOS transistor Q33 having a source-drain path between the node ND17 and a data line RO⁻, and a gate connected to the column address selecting line YSW.

Further, the sense amplifier includes an N-type MOS transistor Q11 having a source-drain path between the bit line BL' and a bit line BL, and a gate for receiving the transfer gate activate signal TG, and an N-type MOS transistor Q12 having a source-drain path between the bit line BL'⁻ and a bit line BL⁻, and a gate for receiving the transfer gate activate signal TG.

The pairs of bit lines BL and BL⁻ are included in a DRAM cell array. The DRAM cell array includes a plurality of a pair of bit lines, word lines, and DRAM cells. However, in FIG. 2, only one DRAM cell is shown, for example. The DRAM cell includes an N-type MOS transistor Q10 having a gate connected a word line WL, and a source-drain path between the bit line BL and a node ND18, and a capacitor C10 connected between the node ND18 and a reference voltage (e.g., ground voltage).

FIG. 3 shows a timing chart for explaining an operation of the signal generator shown in FIG. 1 and the sense amplifier shown in FIG. 2, for reading data. For example, the capacitor C10 has a voltage which represents an active level (e.g., "1" or "H").

At a time t0, the MOS transistor $Q_{10}$ turns ON, because the word line WL is activated to an active level (e.g., "1" or "H"). As a result, a voltage of the bit line BL rises slightly. At this time, the MOS transistors $Q_{11}$ and $Q_{12}$ as transfer gates are ON, because the transfer gate control signal TG has an active level (e.g., "1" or "H"). Therefore, the pair of bit lines BL and BL⁻ is connected to the pair of bit lines BL' and BL'⁻ electrically. As a result, the voltage of the bit line BL is transmitted to the bit line BL'.

At a time t1, the sense amplifier activate signal φ is changed to an active level (e.g., "1" or "H") from an inactive level (e.g., "0" or "L"). Therefore, the first control signal generator 3 changes the first control signal $\phi_T$ to an inactive level (e.g., "0" or "L") from an active level (e.g., "1" or "H") between a time t1 and time t4, and the second control signal generator 4 changes the second control signal $\phi_p$ to an inactive level (e.g., "0" or "L") from an active level (e.g., "1" or "H") between a time t1 and time t3.

At this time, the transfer gate control signal TG is changed to an inactive level (e.g., "0" or "L") in response to the first control signal $\phi_T$. Therefore, the pair of bit lines BL' and BL'⁻ is disconnected electrically from the pair of bit lines BL and BL⁻.

Further, between the time t1 and the time t3, the nodes ND5 and ND12 are electrically connected to the second reference voltage (e.g., the internal voltage $V_{INT}$), and moreover, to the third reference voltage (e.g., the external voltage $V_{cc}$) for charging the bit line BL' faster, although the external voltage $V_{cc}$ is not used inside of the conventional system.

As a result, a voltage of the bit lines BL' goes to the internal voltage $V_{INT}$ and a voltage of the bit line BL'⁻ goes to 0 V (e.g., ground voltage), immediately.

It is noted that the period between the time t1 and the time t3 is designed for voltage on the nodes ND5 and ND12 not to exceed the internal voltage $V_{INT}$ for protecting the DRAM cell.

At a time t3', a voltage of the column address selecting line YSW is changed to an active level (e.g., "1" or "H") from an inactive level (e.g., "0" or "L"). Therefore, the reference voltage $V_{ss}$ is outputted to the data line RO through the MOS transistors Q30 and Q32, because a voltage of the bit line BL' is the second reference voltage (e.g., the internal voltage $V_{INT}$) at this time. On the contrary, the reference voltage $V_{ss}$ is not outputted to the data line RO⁻ through the MOS transistors Q31 and Q33, because a voltage of the bit line BL'⁻ is the first reference voltage (e.g., ground voltage) at this time.

As mentioned above, the conventional DRAM system shown in FIGS. 1 and 2 amplifies and outputs data faster because the system uses the external voltage temporarily for charging bit lines.

However, the conventional DRAM system mentioned above still has a problem when an amplified data by the sense amplifier is stored (e.g., restored) in the DRAM cell. The operation of restoring data is necessary in a DRAM system, and thus the above problem is a major shortcoming of the conventional DRAM system.

As shown in FIG. 3, at the time t4, the transfer gate control signal TG is changed to an active level in response to the first control signal $\phi_T$. Therefore, the pair of bit lines BL' and BL'⁻ is connected electrically to the pair of bit lines BL and BL⁻. Normally, capacities of the bit lines BL and BL⁻ are much larger than capacities of the bit lines BL' and BL'⁻. As a result, a voltage of the first reference voltage signal SAN (e.g., a voltage of the nodes ND4 and ND11) becomes higher than the first reference voltage (e.g., ground voltage) temporarily, until it recovers automatically. On the contrary, a voltage of the second reference voltage signal SAP (e.g., a voltage of the nodes ND5 and ND12) becomes lower (e.g., a voltage drop) than the second reference voltage (e.g., the internal voltage $V_{INT}$) temporarily, until it recovers automatically.

Therefore, the conventional DRAM system cannot restore the data outputted to the data lines RO and RO⁻ immediately, until the voltage drop recovers. The system has the same problem in the writing operation as in the reading operation. Therefore, an explanation of the writing operation for writing data to the DRAM cell is omitted herein.

As a result, the conventional DRAM system cannot operate instructions with high speed although a speed for outputting data becomes faster.

Hereinafter, a time needed for restoring data to a DRAM cell is calculated.

A voltage v of the node ND5 after the time t4 is shown in an equation (1), wherein a number of pairs of bit lines is N (e.g., wherein N is an integer), a capacitance of the pair of the bit line is $C_D$, a capacitance of the sense amplifier and a wiring between the node ND5 and the node ND12 is $C_{SA}$, and a resistance of the sense amplifier and a wiring between the node ND5 and the node ND12 is $R_{SA}$.

$$v \approx \frac{V_{INT}}{2}\left\{2 + e^{-\frac{1}{C_{SA}R_{SA}}(t-t4)} - e^{-\frac{1}{NC_D R_{SA}}(t-tx)}\right\} \quad (1)$$

When the second reference voltage signal SAP falls to its lowest level, dv/dt=0. Therefore, the following equations (2) and (3) are obtained.

$$\frac{1}{C_{SA}} + e^{-\frac{1}{C_{SA}R_{SA}}(t-t4)} = \frac{1}{NC_D}e^{-\frac{1}{NC_D R_{SA}}(t-t4)} \quad (2)$$

$$\left[\frac{1}{C_{SA}} - \frac{1}{NC_D}\right]\frac{1}{R_{SA}}(t-t4) = \ln\frac{NC_D}{C_{SA}} \quad (3)$$

For a 64 M DRAM having a 256-bit memory cell per bit line, for example, N=512, $C_D \approx 0.15$ pF, $C_{SA} \approx 10.0$ pF, and $R_{SA} \approx 150\ \Omega$ are obtained. Therefore, by using the equations (2) and (3), t–t4=3.59 ns and V=0.67 $V_{INT}$ are obtained. Thus, the voltage of the second reference voltage signal SAP drops to 67% of the internal voltage $V_{INT}$ after the time t4.

After 3.59 ns has passed after the time t4, a voltage of the second reference voltage signal SAP recovers to the internal voltage $V_{INT}$. If the data is restored to the DRAM cell when the voltage becomes 80%, 85% and 90%, respectively, of the internal voltage $V_{INT}$, 19.78 ns is needed from the time t4 at the 80%, 23.32 ns is needed from the time t4 at the 85%, and 28.30 ns is needed from the time t4 at the 90%, respectively.

Thus, if the conventional DRAM memory system is designed to restore data when a voltage of the bit line is 85% of the internal voltage $V_{INT}$, at least 23.3 ns are needed.

For operating instructions with high speed, Japanese Patent Application Laid-Open No. Hei 5-89674 discloses a DRAM system having a plurality of sense amplifiers per each pair of bit lines. However, the DRAM system becomes very large, which is undesirable.

As mentioned above, the conventional DRAM systems cannot achieve simultaneously high speed operation and high integration in a smaller semiconductor chip. This is a problem.

SUMMARY OF THE INVENTION

In view of the foregoing problems of the conventional DRAM system, it is therefore an object of the present invention to provide an improved single-chip semiconductor DRAM system.

It is another object of the present invention to provide an improved method for operating the DRAM system.

In a first aspect, a DRAM system according to the present invention includes a DRAM cell array having a first bit line connected to a DRAM cell, wherein the DRAM cell stores a first voltage which is less than a second voltage, and a sense amplifier portion having a second bit line and for amplifying data of the second bit line to the first voltage. The sense amplifier portion connects electrically the first bit line and the second bit line, supplies a third voltage which is greater than the second voltage to the second bit line when the first bit line and the second bit line are connected electrically, and stops supplying the third voltage before a voltage of the second bit line reaches the first voltage.

With the unique and unobvious structure of the present invention, the sense amplifier portion connects the third voltage to the second bit line when the first and second bit lines are connected together. Therefore, the first and second bit lines are charged faster than in the conventional DRAM system. As a result, the DRAM system according to the present invention is operated with high speed and yet the DRAM system has relatively high integration as compared to the conventional system.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
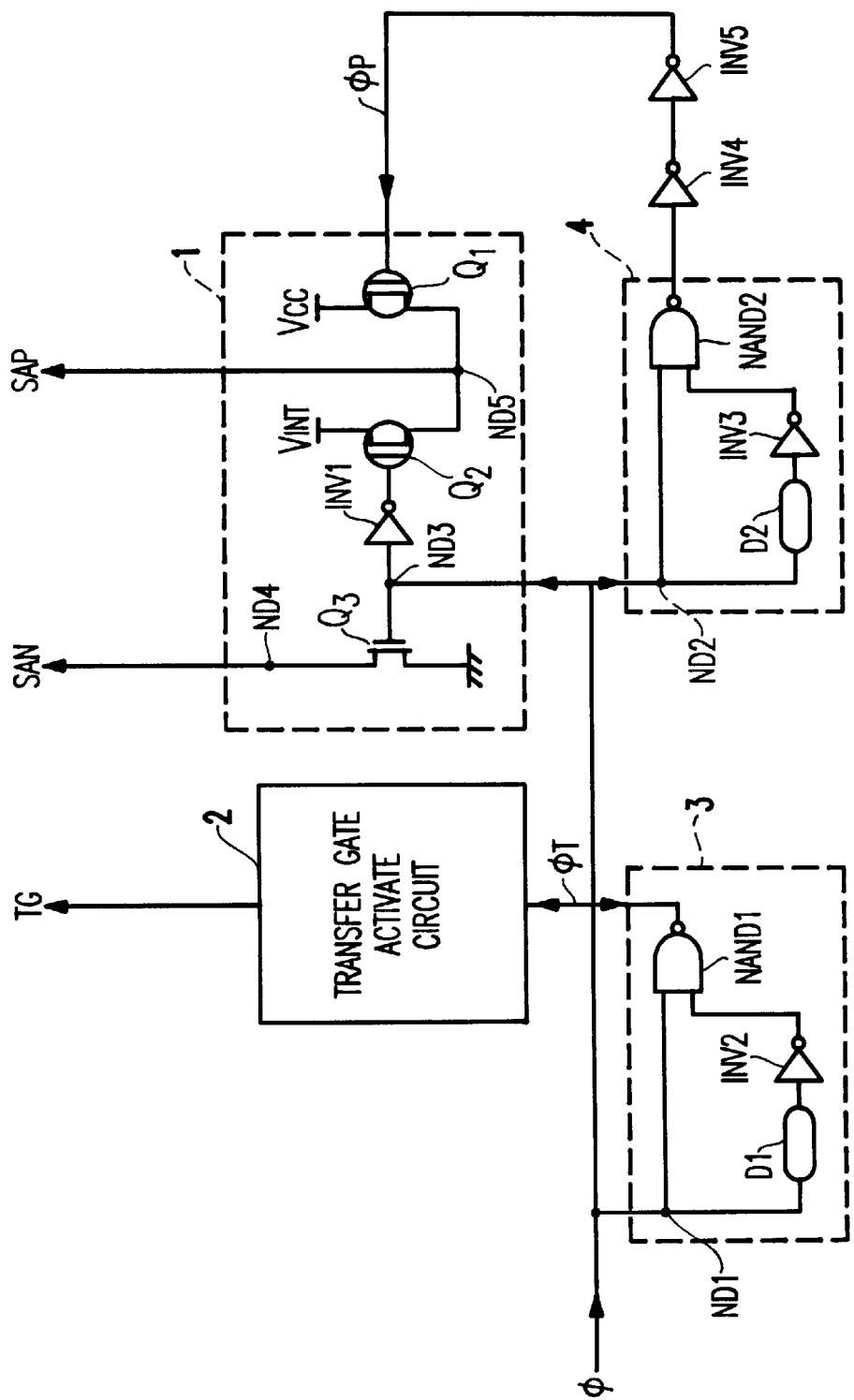
FIG. 1 is a circuit diagram of a signal generator in a conventional dynamic random access memory (DRAM) system (e.g., related art but not prior art)
Figure 2:
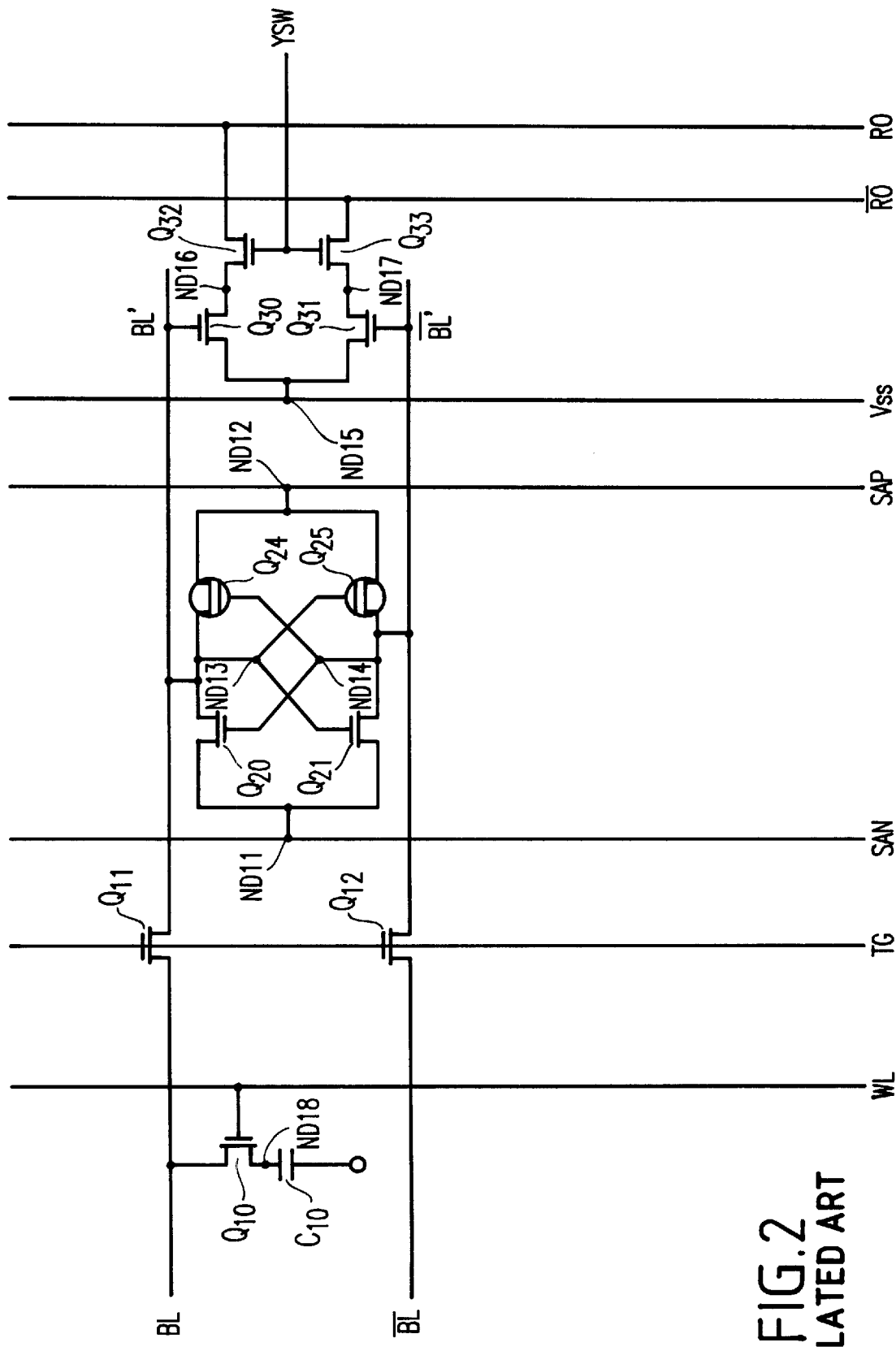
FIG. 2 is a circuit diagram of a sense amplifier in the conventional DRAM system.
Figure 3:
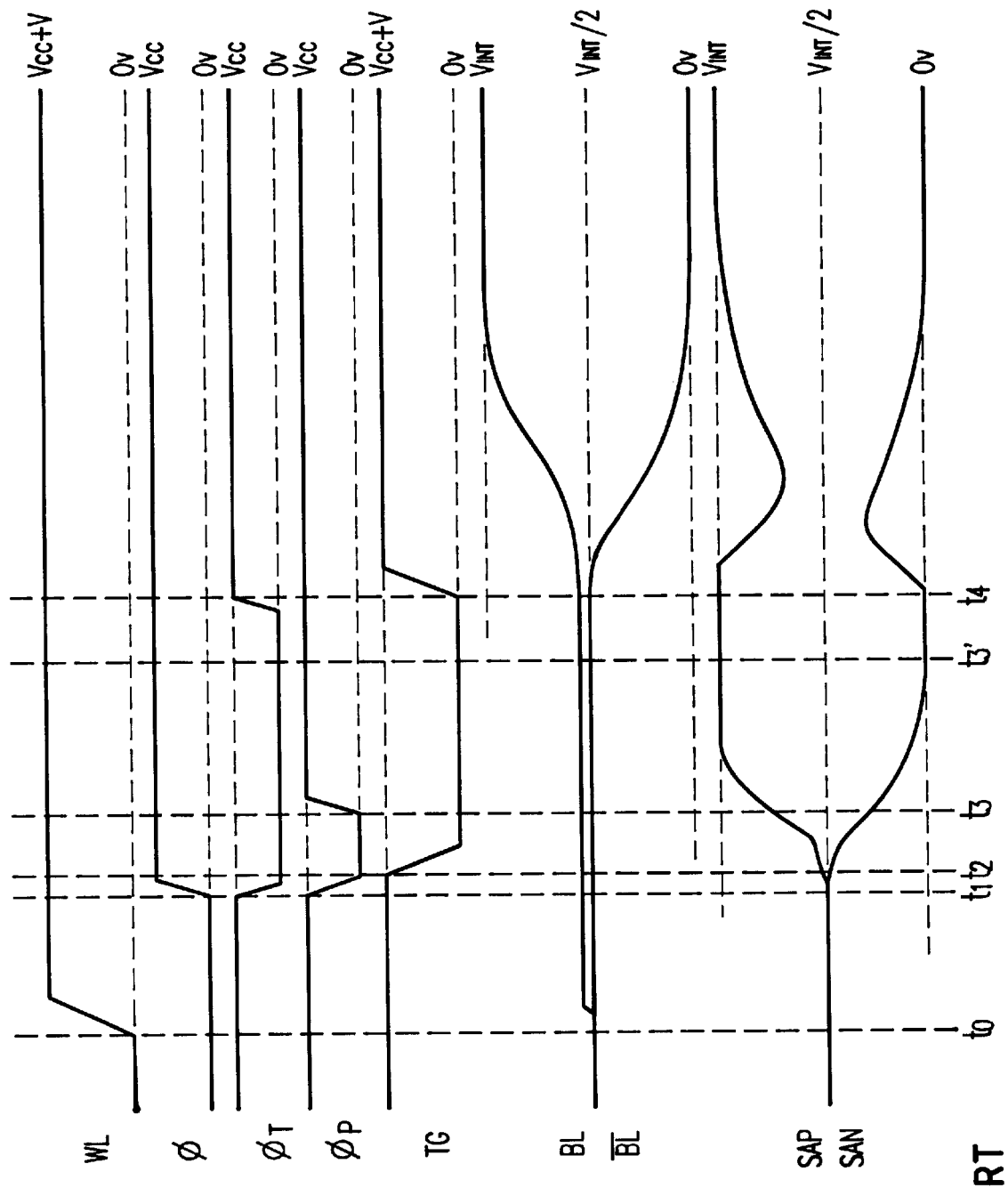
FIG. 3 is a timing chart illustrating a reading operation of the conventional DRAM system.
Figure 4:
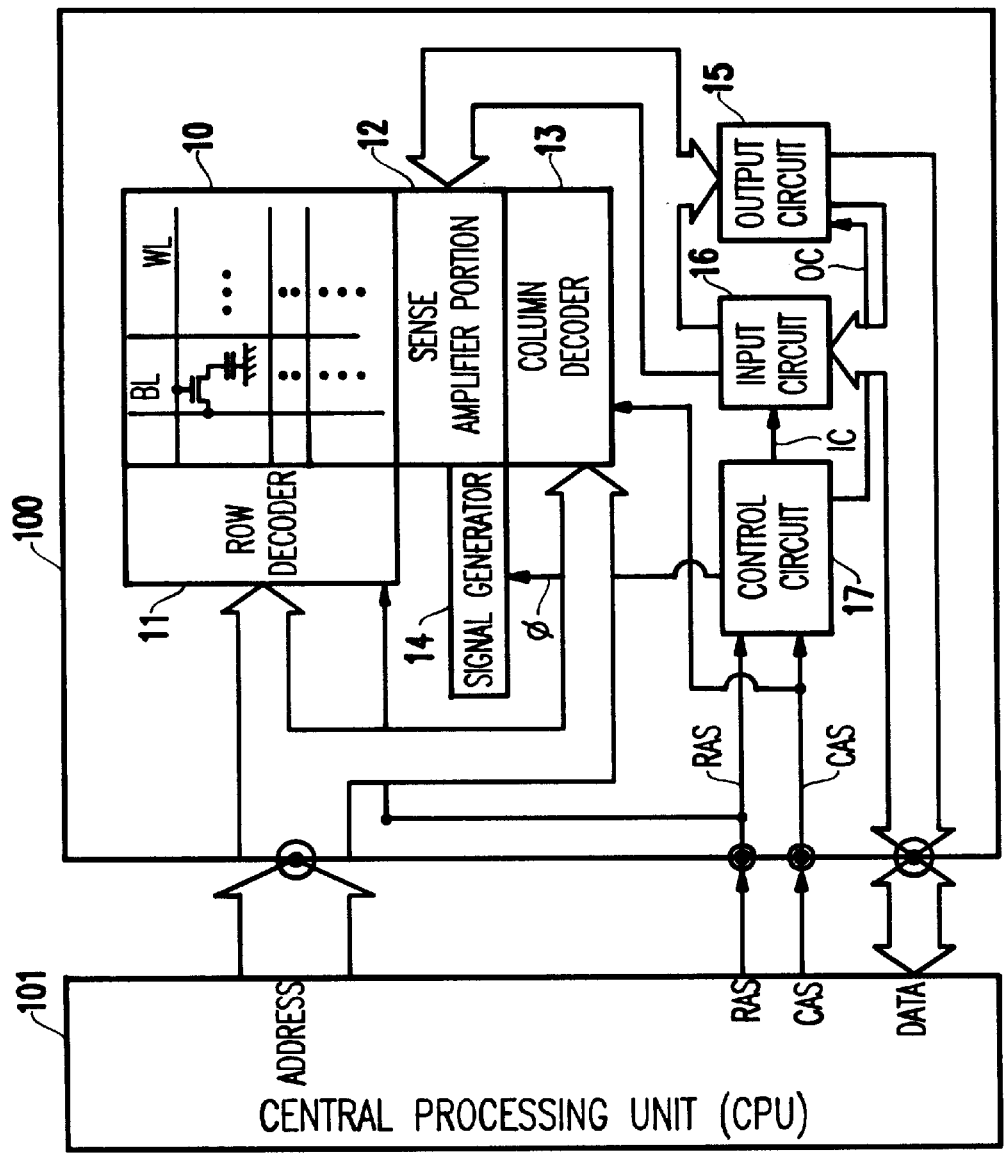
FIG. 4 is a diagram of a single-chip semiconductor DRAM system and an external central processing unit (CPU) according to the present invention.
Figure 5:
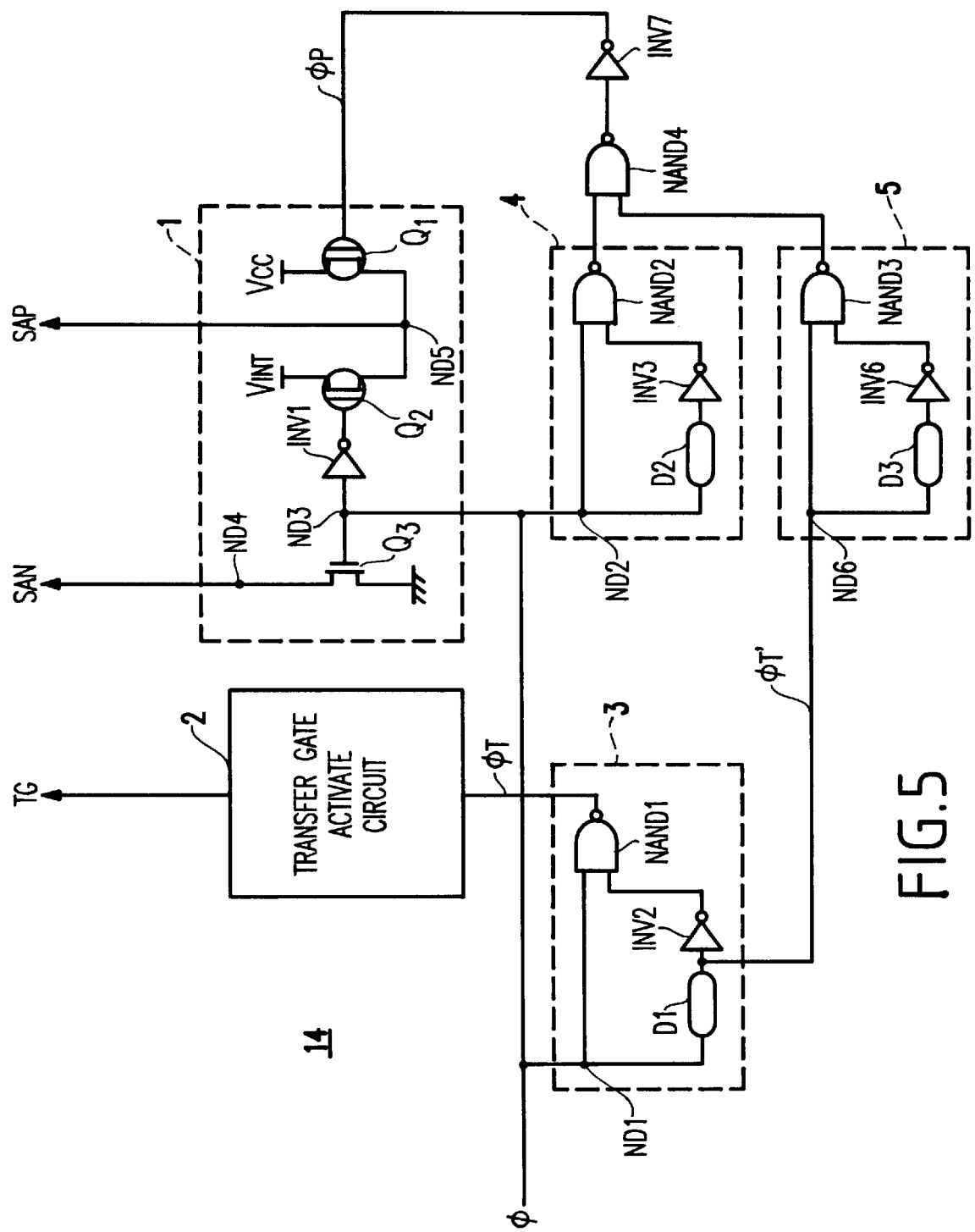
FIG. 5 is a circuit diagram of a signal generator according to a first embodiment of the present invention.
Figure 6:
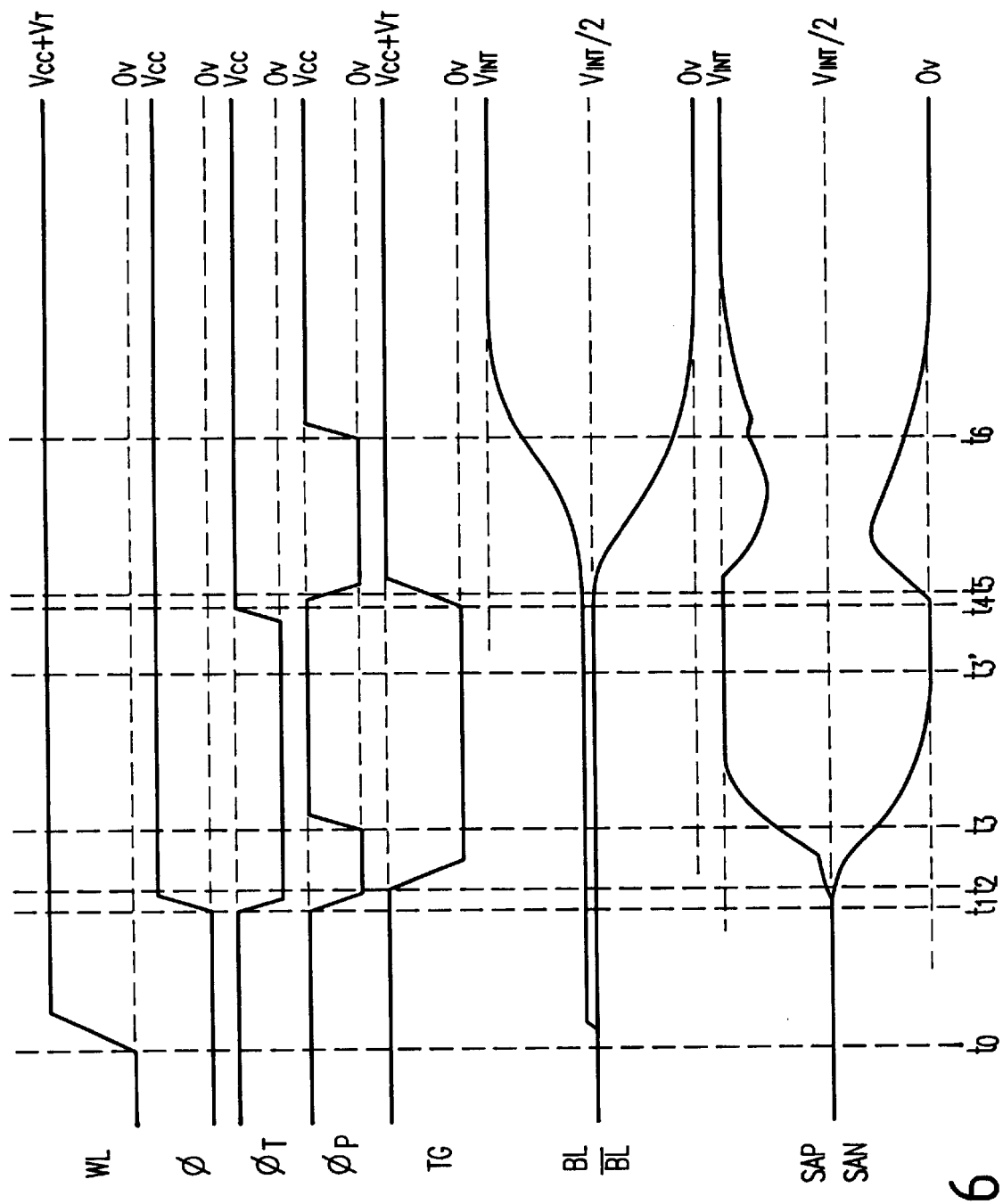
FIG. 6 is a timing chart illustrating a reading operation of the single-chip semiconductor DRAM system according to the present invention.

Referring now to the drawings, and more particularly to FIGS. 4–6, a single-chip semiconductor dynamic random access (DRAM) memory system 100 is described according to a first embodiment of the present invention. The same parts in FIGS. 4 and 5 as those in FIGS. 1 and 2 are numbered with the same reference numerals as in FIGS. 1 and 2. For brevity, explanation of these parts are omitted from the following description.

In the first embodiment, the DRAM system 100 includes a DRAM array 10 including a plurality of bit lines BL, word lines WL, and DRAM cells, a row decoder 11, a column decoder 13, a sense amplifier portion 12, a signal generator 14, an output circuit 15, an input circuit 16 and a control circuit 17.

Further, the DRAM system 100 is connected to an external central processing unit (CPU) 101 for executing instructions.

The CPU 101 executes an instruction by using data from the DRAM system 100, outputs a row address strobe (RAS) signal, a column address strobe (CAS) signal and an address signal.

When the CPU 101 changes the RAS signal to an active level (e.g., "1") from an inactive level (e.g., "0"), the row decoder 11 decodes the address signal, and activates (selects) the word line WL corresponding to the address signal. When the CPU 101 changes the CAS signal to an active level (e.g., "1") from an inactive level (e.g., "0"), the column decoder 13 decodes the address signal, and activates (selects) the bit line WL corresponding to the address signal.

The control circuit 17 changes the amplifier activate signal φ to an active level (e.g., "1") from an inactive level (e.g., "0"), when the RAS signal is changed to an active level. The control circuit 17 also changes an input control signal IC to an active level (e.g., "1") from an inactive level (e.g., "0"), when the timing of the RAS signal and the CAS signal represents a writing operation for writing data into the DRAM array 10. Further, the control circuit 17 changes an output control signal OC to an active level (e.g., "1") from an inactive level (e.g., "0"), when the timing of the RAS signal and the CAS signal represents a reading operation for reading data from the DRAM array 10.

The input circuit 16 transmits data from the CPU 101 to the sense amplifier portion 12, when the input control signal IC has an active level, and does not transmit the data from the CPU 101 to the sense amplifier portion 12, when the input control signal IC has an inactive level.

The output circuit 15 transmits data from the sense amplifier portion 12 to the CPU 101, when the output control signal OC has an active level, and does not transmit the data from the sense amplifier portion 12 to the CPU 101, when the output control signal OC has an inactive level.

The sense amplifier portion 12 includes a plurality of sense amplifiers corresponding to the pair of bit lines BL and BL⁻, as shown in FIG. 2.

The signal generator 14 generates the first reference voltage signal SAN, the second reference voltage signal SAP, and the transfer gate activate signal TG, in response to the amplifier activate signal φ.

FIG. 5 shows a circuit diagram of the signal generator 14. The signal generator 14 includes the sense amplifier activate circuit 1, the transfer gate activate circuit 2, the first control signal generator 3, and the second control signal generator 4, similarly to the structure shown in FIG. 1. The signal generator 14 further includes a third control signal generator 5, a NAND circuit NAND4, and an inverter INV7.

The third control signal generator 5 includes a node ND6, connected to the output node of the delay circuit D1 in the first control signal generator 3, for receiving the delayed amplifier activate signal φ (e.g., wherein the delayed amplifier activate signal φ is a signal φ$_T$), a delay circuit D3 having an input node connected to the node ND6 and an output node for outputting a delayed signal φ$_T$(e.g., wherein a delay time by the delay circuit D3 is predetermined), an inverter INV6 having an input node connected to the output node of the delay circuit D3 and an output node for outputting an inverted signal of the delayed signal φ$_T$, and a NAND circuit NAND3 having a first input node connected to the node ND6, a second input node connected to the output node of the inverter INV6, and an output node.

The NAND circuit NAND4 has a first input node connected to the output node of the NAND circuit NAND2, a second input node connected to the output node of the NAND circuit NAND3, and an output node.

The inverter INV7 has an input node connected to the output node of the NAND circuit NAND4 and an output node connected to the gate of the MOS transistor Q1.

FIG. 6 shows a timing chart for explaining an operation of the signal generator 14 shown in FIG. 5 and the sense amplifier portion 12 shown in FIG. 4 (e.g., a part of the sense amplifier portion 12 is shown in FIG. 2), for reading data. In the exemplary operation, the capacitor C10 has a voltage representing an active level (e.g., "1").

At a time t0, the MOS transistor Q$_{10}$ turns ON, because the word line WL is activated to an active level (e.g., "1"). As a result, a voltage of the bit line BL rises slightly. At this time, the MOS transistors Q$_{11}$ and Q$_{12}$ as transfer gates are ON, because the transfer gate control signal TG has an active level (e.g., "1" or "H"). Therefore, the pair of bit lines BL and BL⁻ is connected electrically to the pair of bit lines BL' and BL'⁻. As a result, the voltage of the bit line BL is transmitted to the bit line BL'.

At a time t1, the sense amplifier activate signal φ is changed to an active level (e.g., "1") from an inactive level (e.g., "0"). Therefore, the first control signal generator 3 changes the first control signal φ$_T$ to an inactive level (e.g., "0") from an active level (e.g., "1") during a time t1 and time t4, and the second control signal generator 4 changes the second control signal φ$_P$ to an inactive level (e.g., "0") from an active level (e.g., "1") during a period between a time t1 and time t3.

At this time, the transfer gate control signal TG is changed to an inactive level (e.g., "0") in response to the first control signal φ$_T$. Therefore, the pair of bit lines BL' and BL'⁻ is disconnected electrically from the pair of bit lines BL and BL⁻.

Further, between the time t1 and the time t3, the nodes ND5 and ND12 are electrically connected to the second reference voltage (e.g., the internal voltage V$_{INT}$), and moreover, to the third reference voltage (e.g., the external voltage V$_{cc}$) for charging the bit line BL' faster.

As a result, a voltage of the bit line BL' rises to the internal voltage V$_{INT}$ and a voltage of the bit line BL'⁻ decreases to 0 V (e.g., ground voltage), immediately.

It is noted that the period between the time t1 and the time t3 is designed for voltage on the nodes ND5 and ND12 not to exceed the internal voltage V$_{INT}$, thereby for protecting the DRAM cell.

At a time t3', a voltage of the column address selecting line YSW is changed to an active level (e.g., "1") from an inactive level (e.g., "0"). Therefore, the reference voltage V$_{ss}$ is outputted to the data line RO through the MOS transistors Q30 and Q32, because a voltage of the bit line BL' is the second reference voltage (e.g., the internal voltage V$_{INT}$) at this time. On the contrary, the reference voltage V$_{ss}$ is not outputted to the data line RO⁻ through the MOS transistors Q31 and Q33, because a voltage of the bit line BL'⁻ is the first reference voltage (e.g., ground voltage) at this time.

At a time t4, the transfer gate control signal TG is changed to an active level in response to the first control signal φ$_T$. Therefore, the pair of bit lines BL' and BL'⁻ is connected electrically to the pair of bit lines BL and BL⁻.

As a result, a voltage of the first reference voltage signal SAN (e.g., a voltage of the nodes ND4 and ND11) starts to go higher than the first reference voltage (e.g., ground voltage), and a voltage of the second reference voltage signal SAP (e.g., a voltage of the nodes ND5 and ND12) starts to go lower (e.g., a voltage drop) than the second reference voltage (e.g., the internal voltage V$_{INT}$).

However, in the first embodiment, the DRAM system 100 recovers the voltage drop faster than the conventional DRAM system, as mentioned below.

At a time t5, the second control signal generator 4 changes the second control signal φ$_P$ to an inactive level (e.g., "0") from an active level (e.g., "1") and keeps an inactive level between a time t5 and time t6.

Therefore, between the time t5 and the time t6, the nodes ND5 and ND12 are electrically connected to the second reference voltage (e.g., the internal voltage $V_{INT}$), and moreover, to the third reference voltage (e.g., the external voltage $V_{cc}$), thereby stopping the voltage drop and charging the bit lines BL and BL' faster.

As a result, a voltage of the bit lines BL and BL' rises to the internal voltage $V_{INT}$ and a voltage of the bit lines $^-$BL and BL'$^-$ decreases to 0 V (e.g., ground voltage) faster than the conventional DRAM system shown in FIG. 1.

It is noted that the period between the time t5 and the time t6 is designed (e.g., wherein a pulse width corresponding to the period is produced by the delay circuit D3) for voltage on the nodes ND5 and ND12 not to exceed the internal voltage $V_{INT}$, thereby for protecting the DRAM cell.

As mentioned above, the DRAM system 100 executes the reading and restoring operation faster than the conventional DRAM system, because the bit lines BL and BL' are connected temporarily to the third reference voltage (e.g., the external voltage $V_{cc}$), after the bit line BL is connected to the bit line BL'.

Hereinafter, a term for restoring data to a DRAM cell is calculated.

A voltage v' of the node ND5 after the time t4 is shown in equation (4) below, where a number of pairs of bit lines is N (e.g., wherein N is an integer), a capacitance of the pair of the bit line is $C_D$, a capacitance of the sense amplifier and a wiring between the node ND5 and the node ND12 is $C_{SA}$, and a resistance of the sense amplifier and a wiring between the node ND5 and the node ND12 is $R_{SA}$.

$$v \approx \frac{V_{INT}}{2}\left\{2 + e^{-\frac{1}{C_{SA}R_{SA}}(t-t4)} - e^{-\frac{1}{NC_DR_{SA}}(t-t4)}\right\} + \left[V_{CC} - \frac{V_{INT}}{2}\right]\left\{1 - e^{-\frac{1}{NC_DR_{SA}}(t-t5)}\right\} \quad (4)$$

(where $t_5 < t < t_6$.)

For a 64 M DRAM having a 256-bit memory cell per bit line, for exemple, N =512, $C_D \approx 0.15$ pF, $C_{SA} \approx 10.0$ pF, and $R_{SA} \approx 150\Omega$ are obtained. At this time, if the internal voltage $V_{INT}$ is $V_{INT}$=2.2 V, the external voltage $V_{cc}$ is $V_{cc}$=3.3 V and t5=t4, by using the equations (2) and (3), t–t4=1.71 ns and V=0.85 $V_{INT}$ are obtained. Thus, the voltage of the second reference voltage signal SAP drops to 85% of the internal voltage $V_{INT}$ and does not drop to less than 85% of the internal voltage $V_{INT}$ after the time t4.

After 1.71 ns has passed after the time t4, a voltage of the second reference voltage signal SAP recovers to the internal voltage $V_{INT}$. If the data is restored to the DRAM cell when the voltage becomes 80%, 85% and 90%, respectively, of the internal voltage $V_{INT}$, 3.15 ns is needed from the time t4 at the 80%, 3.58 ns is needed from the time t4 at the 85%, and 3.98 ns is needed from the time t4 at the 90%, respectively. To prevent rising above the voltage of the internal voltage $V_{INT}$, the external voltage $V_{cc}$ should be disconnected from the node ND 5 during an interval less than 4.72 ns from the time t4.

As mentioned above, the voltage drop of the DRAM system 100 recovers much more quickly than that of the conventional DRAM system of FIG. 1. Therefore, the DRAM system 100 executes the reading and restoring operation faster than the conventional DRAM system.

Further, the DRAM system 100 has a (e.g., a single) sense amplifier per each pair of bit lines in the sense amplifier portion 12. As mentioned above, Japanese Patent Application Laid-Open No. Hei 5-89674 discloses a DRAM system having a plurality of sense amplifiers per each pair of bit lines. Therefore, a chip size of the DRAM system 100 is smaller than that of the conventional DRAM system disclosed in Japanese Patent Application Laid-Open No. Hei 5-89674. Thus, the DRAM system according to the present invention achieves high speed operation and high integration.

Figure 7:
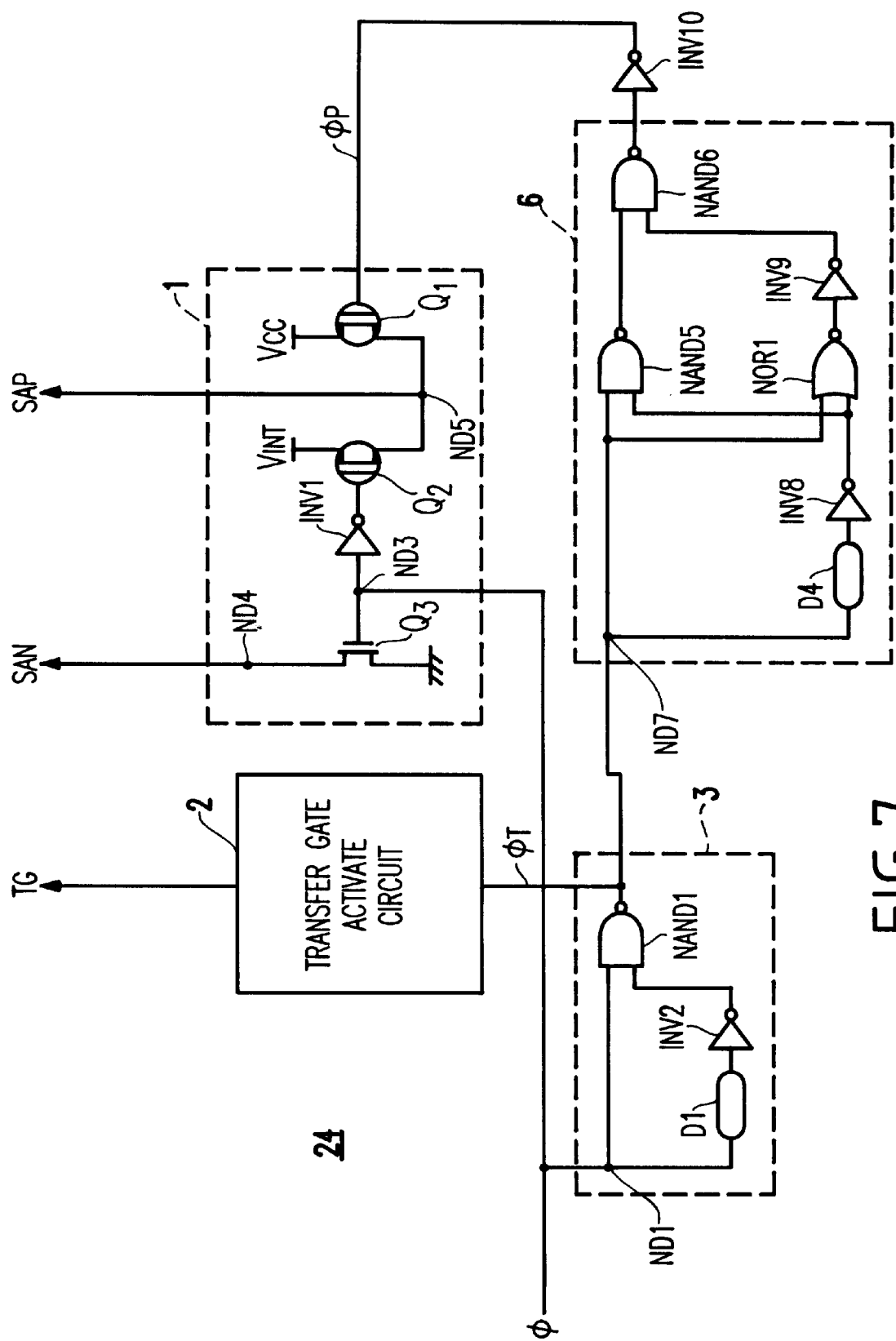
FIG. 7 is a circuit diagram of a signal generator according to a second embodiment of the present invention.

Referring now to FIG. 7, a signal generator 14 according to a second embodiment of the present invention is described. The same parts in FIG. 7 as those in FIG. 5 are numbered with the same reference numerals as in FIG. 5, and for brevity, explanation of these parts are omitted from the following description.

In the second embodiment, a signal generator 24 includes the sense amplifier activate circuit 1, the transfer gate activate circuit 2, and the first control signal generator 3. The signal generator 24 further includes a fourth control signal generator 6 and an inverter INV10, instead of the third and fourth control signal generators 4 and 5, the NAND circuit NAND4, and the inverter INV7.

The fourth control signal generator 6 includes a node ND7, connected to the output node of the NAND circuit NAND1 in the first control signal generator 3, for receiving the first control signal $\phi_T$, a delay circuit D4 having an input node connected to the node ND7 and an output node for outputting a delayed first control signal $\phi_T$ (e.g., wherein a delay time of the delay circuit D4 is predetermined), an inverter INV8 having an input node connected to the output node of the delay circuit D4 and an output node for outputting an inverted signal of the delayed first control signal $\phi_T$, a NAND circuit NAND5 having a first input node connected to the node ND7, a second input node connected to the output node of the inverter INV8, and an output node, a NOR circuit NOR1 having a first input node connected to the node ND7, a second input node connected to the output node of the inverter INV8, and an output node, an inverter INV9 having an input node connected to the output node of the NOR circuit NOR1 and an output, a NAND circuit NAND6 having a first input node connected to the output node of the NAND circuit NAND5, a second input node connected to the output node of the inverter INV9, and an output node.

The inverter INV10 has an input node connected to the output node of the NAND circuit NAND6 and an output node connected to the gate of the MOS transistor Q1.

A timing chart for explaining an operation of the signal generator 24 shown in FIG. 7 is the same as the timing chart shown in FIG. 6. Therefore, for brevity, an explanation of the operation is omitted.

In the second embodiment, a number of elements of the signal generator 24 is less than that of the signal generator 14 shown in FIG. 5. Specifically, the number of delay circuits is decreased, although the delay circuit includes a plurality of inverters connected in series generally. Therefore, a chip size of the DRAM system 100 becomes smaller than that of the first embodiment, and yet high speed operation still is achieved.

As mentioned above, the DRAM system 100 is operated by the external CPU 101 in the first and second embodiments. However, a CPU (e.g., an on-chip CPU) alternatively may be included in a single-chip semiconductor DRAM system, as shown in FIG. 8.

Figure 8:
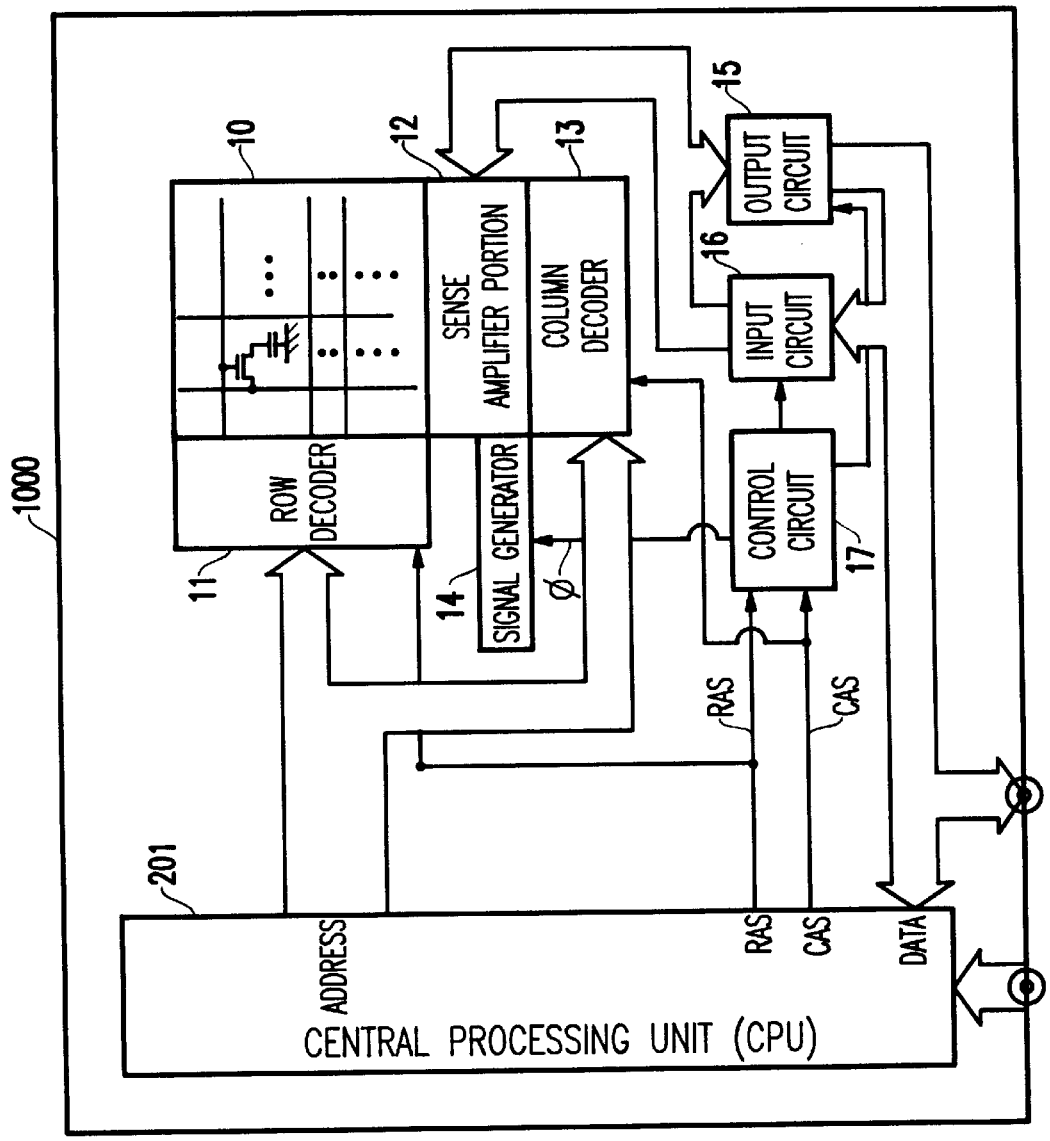
FIG. 8 is a diagram of a single-chip semiconductor DRAM system including an internal CPU according to the present invention.

FIG. 8 shows a single-chip semiconductor DRAM system 1000 including an internal CPU 201. The internal CPU 201 operates the same as the external CPU 101. The same parts in FIG. 8 as those in FIG. 4 are numbered with the same reference numerals as in FIG. 4, and for brevity, explanation of these parts are omitted.

In these embodiments, as known by one of ordinary skill in the art taking the present specification as a whole, the type (e.g., N-type, P-type) of the MOS transistors can be changed depending on the design of the DRAM system.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A dynamic random access memory (DRAM) system, comprising:
    a DRAM cell array having a first bit line connected to a DRAM cell, wherein said DRAM cell stores a first voltage which is less than a second voltage; and
    a sense amplifier portion having a second bit line and for amplifying data of said second bit line to said first voltage,
    wherein said sense amplifier portion connects electrically said first bit line and said second bit line, supplies a third voltage which is greater than said second voltage to said second bit line when said first bit line and said second bit line are connected electrically, and stops supplying said third voltage before a voltage of said second bit line reaches said first voltage,
    wherein said second voltage comprises a break-down voltage of said DRAM cell,
    wherein said DRAM cell array further comprises a third bit line, and said sense amplifier portion further comprises a fourth bit line, and a sense amplifier connected to said second bit line and said fourth bit line;
    wherein said sense amplifier portion connects electrically said third bit line and said fourth bit line, supplies said third voltage to said second bit line when said third bit line and said fourth bit line are connected electrically, and stops supplying said third voltage before a voltage of said second bit line reaches said first voltage,
    wherein said sense amplifier portion connects said first bit line and said second bit line, and said third bit line and said fourth bit line, when said data is stored to said DRAM cell,
    wherein said sense amplifier comprises:
        a first metal oxide semiconductor (MOS) transistor having a source-drain path between a first node and a third node, and a gate connected to a fourth node;
        a second MOS transistor having a source-drain path between said first node and said fourth node, and a gate connected to said third node;
        a third MOS transistor having a source-drain path between a second node and said third node, and a gate connected to said fourth node; and
        a fourth MOS transistor having a source-drain path between said second node and said fourth node, and a gate connected to said third node,
    wherein said second node receives said third voltage, and said first node receives a fourth voltage which is lower than said first voltage.

2. The DRAM system as recited in claim 1, wherein said sense amplifier portion further comprises:
    a fifth MOS transistor having a source-drain path connected to said first and second bit lines; and
    a sixth MOS transistor having a source-drain path connected to said third and fourth bit lines,
    wherein said fifth and sixth MOS transistors are activated when said data is stored to said DRAM cell.

3. The DRAM system as recited in claim 2, wherein said sense amplifier portion further comprises:
    a signal generating portion for receiving a first signal, for changing a second signal received by gates of said fifth and sixth MOS transistors to an inactive level for inactivating said fifth and sixth MOS transistors during a first predetermined time period until said first signal is changed to an active level, for supplying said third voltage to said second node during a second predetermined time period included in said first predetermined time period until said first signal is changed to an active level, and for supplying said third voltage to said second node during a third predetermined time period after said first predetermined time period has expired.

4. The DRAM system as recited in claim 3, wherein said signal generating portion comprises:
    a third node for receiving said first signal;
    a first delay circuit having an input node connected to said third node and an output node;
    a first inverter having an input node connected to said output node of said first delay circuit and an output node;
    a first NAND circuit having a first input node connected to said third node, a second input node connected to said output node of said first inverter, and an output node connected to said gates of said fifth and sixth MOS transistors;
    a fourth node for receiving said first signal;
    a second delay circuit having an input node connected to said fourth node and an output node;
    a second inverter having an input node connected to said output node of said second delay circuit and an output node;
    a second NAND circuit having a first input node connected to said fourth node, a second input node connected to said output node of said second inverter, and an output node;
    a fifth node connected to said output node of said first delay circuit;
    a third delay circuit having an input node connected to said fifth node and an output node;
    a third inverter having an input node connected to said output node of said third delay circuit and an output node;
    a third NAND circuit having a first input node connected to said fifth node, a second input node connected to said output node of said third inverter, and an output node;
    a fourth NAND circuit having a first input node connected to said output node of said second NAND circuit, a second input node connected to said output node of said third NAND circuit, and an output node;
    a fourth inverter having an input node connected to said output node of said fourth NAND circuit and an output node;
    a sixth node for receiving said first signal;
    a seventh MOS transistor having a gate connected to said sixth node and a source-drain path connected between a first voltage source for supplying said fourth voltage and said first node;
    a fifth inverter having an input node connected to said sixth node and an output node;
    an eighth MOS transistor having a gate connected to said output node of said fifth inverter and a source-drain path connected between said second node and a second voltage source for supplying said first voltage; and a ninth MOS transistor having a gate connected to said output node of said fourth inverter and a source-drain path connected between said second node and a third voltage source for supplying said third voltage.

5. The DRAM system as recited in claim 4, wherein said first, second, fifth, sixth and seventh MOS transistors respectively comprise a first conductivity-type MOS transistor, and said third, fourth, eighth and ninth MOS transistors respectively comprise a second conductivity-type MOS transistor.

6. The DRAM system as recited in claim 5, wherein said first conductivity-type comprises an N-type, and said second conductivity-type comprises a P-type.

7. The DRAM system as recited in claim 6, wherein said fourth voltage comprises a ground voltage.

8. The DRAM system as recited in claim 7, wherein said DRAM system is formed on a single semiconductor chip.

9. The DRAM system as recited in claim 8, wherein said DRAM system is operated by an on-chip central processing unit (CPU).

10. The DRAM system as recited in claim 8, wherein said DRAM system is operated by an off-chip central processing unit (CPU).

11. The DRAM system as recited in claim 3, wherein said signal generating portion comprises:

a third node for receiving said first signal;

a first delay circuit having an input node connected to said third node and an output node;

a first inverter having an input node connected to said output node of said first delay circuit and an output node;

a first NAND circuit having a first input node connected to said third node, a second input node connected to said output node of said first inverter, and an output node connected to said gates of said fifth and sixth MOS transistors;

a fourth node for receiving said first signal;

a second delay circuit having an input node connected to said fourth node and an output node;

a second inverter having an input node connected to said output node of said second delay circuit and an output node;

a second NAND circuit having a first input node connected to said fourth node, a second input node connected to said output node of said second inverter, and an output node;

a first NOR circuit having a first input node connected to said fourth node, a second input node connected to said output node of said second inverter, and an output node;

a third inverter having an input node connected to said output node of said first NOR circuit and an output node;

a third NAND circuit having a first input node connected to said output node of said second NAND circuit, a second input node connected to said output node of said third inverter, and an output node;

a fourth inverter having an input node connected to said output node of said third NAND circuit and an output node;

a fifth node for receiving said first signal;

a seventh MOS transistor having a gate connected to said fifth node and a source-drain path connected between a first voltage source for supplying said fourth voltage and said first node;

a fifth inverter having an input node connected to said fifth node and an output node;

an eighth MOS transistor having a gate connected to said output node of said fifth inverter and a source-drain path connected between said second node and a second voltage source for supplying said first voltage; and a ninth MOS transistor having a gate connected to said output node of said fourth inverter and a source-drain path connected between said second node and a third voltage source for supplying said third voltage.

12. The DRAM system as recited in claim 11, wherein said first, second, fifth, sixth and seventh MOS transistors respectively comprise a first conductivity-type MOS transistor, and said third, fourth, eighth and ninth MOS transistors respectively comprise a second conductivity-type MOS transistor.

13. The DRAM system as recited in claim 12, wherein said first conductivity-type comprises an N-type, and said second conductivity-type comprises a P-type.

14. The DRAM system as recited in claim 13, wherein said fourth voltage comprises a ground voltage.

15. The DRAM system as recited in claim 14, wherein said DRAM system is formed on a single semiconductor chip.

16. The DRAM system as recited in claim 15, wherein said DRAM system is operated by an on-chip central processing unit (CPU).

17. The DRAM system as recited in claim 16, wherein said DRAM system is operated by an off-chip central processing unit (CPU).

18. A semiconductor memory device comprising:

a bit line;

a transfer switch inserted in series into said bit line to divide said bit line into a first portion and a second portion;

a memory cell coupled to said first portion;

a sense amplifier coupled to said second portion and having a power supply voltage line;

a first control circuit turning said transfer switch ON to transfer a voltage relative to data stored in said memory cell to said second portion through said first portion, and thereafter turning said transfer switch OFF to allow said sense amplifier to amplify the voltage transferred onto said second portion, and thereafter turning said transfer switch ON again to allow said sense amplifier to restore data into said memory cell; and a second control circuit supplying a first power voltage to said power supply voltage line of said sense amplifier when said transfer switch is turned OFF, and supplying a second power voltage to said power supply voltage line of said sense amplifier when said transfer switch is turned ON again, said second voltage being greater than said first voltage.

19. The semiconductor memory device as claimed in claim 18, wherein said second control circuit supplies said first power voltage again to said power supply voltage line after said second control circuit supplies said second power voltage to said power supply voltage line during a predetermined period.

20. The semiconductor memory device as claimed in claim 19, wherein said second control circuit includes:

first and second delay circuits each of which delays a sense signal to generate first and second delay signals;

a first transistor connected between a first power voltage line supplying said first power voltage and said power supply voltage line of said sense amplifier; and a second transistor connected between a second power voltage line supplying said second power voltage and said power supply voltage line of said sense amplifier, said first transistor being turned ON in response to said first delay signal, and said second transistor being turned ON in response to said second delay signal.

21. A semiconductor memory device comprising:

a sense amplifier operating in a data-sensing state in which a voltage appearing on a bit line in response to data read out of a selected memory cell is sensed and amplified, and operating in a data-restoring state following said data-sensing state to restore data into said selected memory cell; and a control circuit controlling said sense amplifier to operate on a first power voltage in said data-sensing state and on a second power voltage in said data-restoring state, said second power voltage being greater than said first power voltage.

* * * * *